US009396907B2

(12) United States Patent
Otten et al.

(10) Patent No.: US 9,396,907 B2
(45) Date of Patent: Jul. 19, 2016

(54) METHOD OF CALIBRATING A SCANNING TRANSMISSION CHARGED-PARTICLE MICROSCOPE

(71) Applicant: FEI Company, Hillsboro, OR (US)

(72) Inventors: Maximus Theodorus Otten, Best (NL); Abigaël Adriana Maria Kok, Eindhoven (NL); Martin Verheijen, Geldrop (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/795,704

(22) Filed: Jul. 9, 2015

(65) Prior Publication Data
US 2016/0013016 A1    Jan. 14, 2016

(30) Foreign Application Priority Data
Jul. 10, 2014  (EP) .................................... 14176529

(51) Int. Cl.
*H01J 37/28* (2006.01)
*H01J 37/20* (2006.01)
*H01J 37/244* (2006.01)

(52) U.S. Cl.
CPC ................ *H01J 37/28* (2013.01); *H01J 37/20* (2013.01); *H01J 37/244* (2013.01);
(Continued)

(58) Field of Classification Search
CPC ... H01J 37/28; H01J 37/20; H01J 2237/2826; H01J 37/244; H01J 2237/28
See application file for complete search history.

(56) References Cited

U.S. PATENT DOCUMENTS 6,770,867 B2    8/2004 Lezec et al.
6,807,314 B1 *  10/2004 Nikitin ................. G02B 21/365
                                                  250/310

(Continued)

FOREIGN PATENT DOCUMENTS

JP        2009016181        1/2009

OTHER PUBLICATIONS

Escovitz, W. H., et al., "Scanning Transmission Ion Microscope with a Field Ion Source," Proc. Nat. Acad. Sci. USA, May 1975, vol. 72, No. 5, pp. 1826-1828.

(Continued)

*Primary Examiner* — David Porta
*Assistant Examiner* — Mindy Vu
(74) *Attorney, Agent, or Firm* — Scheinberg & Associates, PC; Michael O. Scheinberg

(57) ABSTRACT

A method of calibrating a Scanning Transmission Charged-Particle Microscope, operable in
a non-scanning mode, whereby said beam is relatively broad, and
a scanning mode, whereby said beam is relatively narrow and an image is formed as a function of scan position of said beam,
the method comprising:
providing a calibration specimen on said specimen holder;
in non-scanning mode, using said detector to form a calibration image of the calibration specimen, using a given configuration of said imaging system;
utilizing a known dimension of said calibration specimen and comparing it to a corresponding dimension in said calibration image to calibrate a characteristic dimension of a field of view of said detector; and,
in scanning mode, recording a beam pattern of said beam in the calibrated field of view of said detector, and examining the recorded beam pattern to derive a geometric aspect thereof.

14 Claims, 2 Drawing Sheets

(52) U.S. Cl.
CPC ..... *H01J 2237/28* (2013.01); *H01J 2237/2802* (2013.01); *H01J 2237/2817* (2013.01); *H01J 2237/2826* (2013.01)

(56) References Cited

U.S. PATENT DOCUMENTS

| | | | |
|---|---|---|---|
| 6,924,489 | B2 | 8/2005 | Olin et al. |
| 8,447,133 | B2 | 5/2013 | Rieger et al. |
| 8,569,693 | B2 | 10/2013 | Bischoff et al. |
| 8,692,196 | B2 | 4/2014 | Tiemeijer et al. |
| 9,188,555 | B2 | 11/2015 | Owen |
| 2006/0038125 | A1* | 2/2006 | Tsuneta ............... G01N 23/22 250/310 |
| 2008/0093551 | A1 | 4/2008 | Tsuneta et al. |
| 2010/0194874 | A1* | 8/2010 | Bierhoff ............... H01J 37/16 348/80 |

OTHER PUBLICATIONS

Unknown, "Electron microscope," //en.wikipedia.org/wiki/Electron_microscope, accessed Jun. 26, 2015, 10 pages.

Unknown, "Scanning electron microscope," //en.wikipedia.org/wiki/Scanning_electron_microscope, accessed Jun. 26, 2015, 17 pages.

Unknown, "Scanning Helium Ion Microscope," //en.wikipedia.org/wiki/Scanning_Helium_Ion_Microscope, accessed Jun. 26, 2015, 2 pages.

Unknown, "Scanning transmission electron microscopy," //en.wikipedia.org/wiki/Scanning_transmission_electron_microscopy, accessed Jun. 26, 2015, 4 pages.

Unknown, "Transmission electron microscopy," //en.wikipedia.org/wiki/Transmission_electron_microscopy, accessed Jun. 26, 2015, 21 pages.

\* cited by examiner

METHOD OF CALIBRATING A SCANNING TRANSMISSION CHARGED-PARTICLE MICROSCOPE

The invention relates to a method of calibrating a Scanning Transmission Charged-Particle Microscope comprising:
  A specimen holder, for holding a specimen;
  A source, for producing a beam of charged particles;
  An illuminator, for directing said beam so as to irradiate the specimen;
  An imaging system, for directing charged particles that traverse the specimen onto a detector;
  Scanning means, for causing said beam to undergo scanning motion relative to a surface of the specimen,
which microscope can be operated in:
  A non-scanning mode, whereby said beam is relatively broad and said detector forms an image without invocation of said scanning means; or
  A scanning mode, whereby said beam is relatively narrow and said detector accumulates an image as a function of scan position of said beam.

The invention also relates to a charged-particle microscope in which such a method can be performed. An example of such a microscope is a TEM with STEM functionality (see below), embodied/used in a certain way according to the invention.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
  In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.
  In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the irradiating electron beam.
More information on some of the topics elucidated here can, for example, be gleaned from the following Wikipedia links:
  http://en.wikipedia.org/wiki/Electron_microscope
  http://en.wikipedia.org/wiki/Scanning_electron_microscope
  http://en.wikipedia.org/wiki/Transmission_electron_microscopy
  http://en.wikipedia.org/wiki/Scanning_transmission-_electron_microscopy
As an alternative to the use of electrons as irradiating beam, charged-particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:
  http://en.wikipedia.org/wiki/Scanning_Helium_Ion_Microscope
  W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).
It should be noted that, in addition to imaging, a charged-particle microscope (CPM) may also have other functionalities, such as performing spectroscopy, examining diffractograms, performing (localized) surface modification (e.g. milling, etching, deposition), etc.

In all cases, a Scanning Transmission Charged-Particle Microscope (STCPM) will comprise at least the following components:
  A radiation source, such as a Schottky electron source or ion gun.
  An illuminator, which serves to manipulate a "raw" radiation beam from the source and perform upon it certain operations such as focusing, aberration mitigation, cropping (with an aperture), filtering, etc. It will generally comprise one or more charged-particle lenses, and may comprise other types of particle-optical component also. If desired, the illuminator can be provided with a deflector system that can be invoked to cause its output beam to perform a scanning motion across the specimen being investigated.
  A specimen holder, on which a specimen under investigation can be held and positioned (e.g. tilted, rotated). If desired, this holder can be moved so as to effect the desired scanning motion of the beam w.r.t. the specimen. In general, such a specimen holder will be connected to a positioning system such as a mechanical stage.
  An imaging system, which essentially takes charged particles that are transmitted through a specimen (plane) and directs (focuses) them onto the employed detector. As with the illuminator referred to above, the imaging system may also perform other functions, such as aberration mitigation, cropping, filtering, etc., and it will generally comprise one or more charged-particle lenses and/or other types of particle-optical components.
  A detector, which may be unitary or compound/distributed in nature, and which can take many different forms, depending on the radiation being detected. Examples include photomultipliers (including solid-state photomultipliers, SSPMs), photodiodes, CMOS detectors, CCD detectors, photovoltaic cells, etc., which may, for example, be used in conjunction with a scintillator film, for instance.
In what follows, the invention may—by way of example—sometimes be set forth in the specific context of electron microscopy. However, such simplification is intended solely for clarity/illustrative purposes, and should not be interpreted as limiting.

When using an STCPM to view a specimen, one is typically not only interested in the presence/configuration of certain features in the specimen (qualitative investigation), but also in their size (quantitative investigation/metrology). To this end, it will generally be necessary to perform some sort of calibration routine that allows definitive/accurate dimensions to be assigned to certain features. Such a routine will typically involve use of some type of calibration specimen, which contains a standard/reference structure (such as a grid/array)

of known/prescribed dimensions. However, although it sounds relatively straightforward, such a calibration procedure can, in practical situations, be problematic, and may yield a sub-optimal result with an inferior level of accuracy. This may be for various reasons, such as the following:

One type of calibration specimen that can be used is a so-called "cross grating", which comprises a grid of repeating structures at a mutual spacing of the order of a few microns. This micron scale makes such a grating suitable for relatively low-magnification calibration (e.g. at magnifications where at least one grid unit fits within the width of the Field Of View (FOV) of the employed detector), but it is unsuitable for use at relatively high magnifications (smaller FOVs). Moreover, the grid dimensions in such a grating are typically not certified, thus causing a relatively large error margin/uncertainty in the calibration process.

A more suitable calibration specimen in this latter regard comprises a crystalline sample, in which atoms or molecules are arranged in a regular matrix at a well-defined lattice spacing. Although the characteristic dimension (lattice length/pitch/constant) of such a specimen is generally certified to high accuracy, it is typically only applicable in relatively high-magnification applications (e.g. for an FOV in which the pixel size is smaller than half the lattice spacing).

When an STCPM is used in scanning mode, there are particular considerations that need to be borne in mind. Although it might be possible to calibrate such an STCPM at its high-magnification limit (small FOV) using a crystalline reference specimen as discussed above, extrapolation to more usual operational magnification ranges of the STCPM (large FOV) would typically involve scaling across several orders of magnitude, with a correspondingly negative effect on attainable accuracy, particularly due to drift effects that are characteristically present in any scanning-type microscope (inherent to its operating principle).

It is an object of the invention to address these issues. In particular, it is an object of the invention to provide a method of calibrating an STCPM in a more accurate manner than that offered by the prior art. More specifically, it is an object of the invention that, in said method, the abovementioned problems of errors due to scaling and drift should be mitigated.

These and other objects are achieved in a method as set forth in the opening paragraph above, which method is characterized by the following steps:

Providing a calibration specimen on said specimen holder;
In non-scanning mode, using said detector to form a calibration image of the calibration specimen, using a given configuration of said imaging system;
Utilizing a known dimension of said calibration specimen and comparing it to a corresponding dimension in said calibration image to calibrate a characteristic dimension of a field of view of said detector;
In scanning mode, recording a beam pattern of said beam in the calibrated field of view of said detector, and examining the recorded beam pattern to derive a geometric aspect thereof.

The phrase "beam pattern" as here employed should be broadly interpreted as referring to a pattern that is created by recording one or more positions of a "spot" produced by a (focused) scan beam. Such positions may be isolated (resulting in "island spots") or juxtaposed (whence a series of spots are regarded as merged, so as to form a line/curve). In particular, such a pattern may comprise a linear tract—which may, for example, be an actual traced-out/scanned (physical) line, or simply an extrapolated conceptual (mathematical) line between defining end points (island spots). The pattern may also comprise geometrical shapes—such as squares, crosses, triangles, etc.—which may be defined by their vertices (island spots) and/or their sides (lines). In essence, the beam pattern is basically a set of one or more recorded beam coordinates in the detector FOV.

This inventive method is inherently different to the prior art in that it is a two-step method that uses a relatively drift-insensitive intermediary (the imaging detector FOV) as a "translator" between a high-magnification domain (in non-scanning mode) and a lower-magnification domain (in scanning mode). A characteristic/reference dimension/scale (e.g. a pixel size) of the detector FOV can be accurately calibrated in non-scanning mode using a fine calibration specimen (such as a crystal lattice), and this calibrated FOV is then, in turn, used to calibrate a (geometric aspect of a) scan motion of the charged-particle beam in scanning mode. In said scanning mode, the method does not rely on making a scanning image of a specimen—which would tend to introduce the drift effects referred to above—but instead relies on recording a simple beam pattern (e.g. a tract corresponding to a full-amplitude X- or Y-deflection of the scanning beam)—i.e. a purely geometrical entity with a characteristic aspect (e.g. a length or angle) that can relatively easily be quantified in the calibrated FOV. In calibrating the FOV, one is effectively calibrating the employed detector at the specific chosen configuration (magnification) of the imaging system.

In an embodiment of the invention, said characteristic dimension of the field of view of the detector is selected from the group comprising a pixel size, a side length, a diagonal length, a diameter, a dimension of a field marker, and combinations hereof. The function of said characteristic dimension in the context of the current invention is to act as a "ruler" or "scale" against which (subsequently viewed) geometric aspects of beam patterns can be measured. In that respect, there is a certain freedom regarding the particular choice of ruler/scale employed for this purpose. In addition to the pixel size already referred to above (a relatively natural choice in the case of pixelated detectors such as CMOS arrays and CCDs), other choices include larger-scale dimensions of the FOV, such as its width, height, diagonal or diameter (for a circular FOV), for example. Alternatively, one could conceive a situation in which the FOV contains a (permanent) field marker (such as a graduated "crosshair" or other type of scale/grid), and said characteristic dimension is then chosen to be a particular dimension (e.g. scale pitch, length/width) of this marker. The skilled artisan will be able to make an appropriate choice in this regard.

In a particular embodiment of the invention, the following applies:

Said beam pattern comprises a linear tract in a given direction;
Said geometric aspect is a length of said linear tract.

Such an embodiment essentially represents the most straightforward enaction of the invention, in that it basically amounts to a line length calibration: a particular linear tract is defined by the scanning beam (in terms of end points or an actual traced path), and the length of this tract is then measured against the (pre-calibrated) characteristic dimension of the FOV. The skilled artisan will realize that insightful choices can be made regarding the particular linear tract that is traced out in the FOV. For example, in a STEM, scanning motion of the imaging electron beam is typically effected using a pair of complementary scan deflectors (e.g. electric coils), which can independently steer the beam in X- and Y-directions away from an optical axis (propagation axis) that extends along a Z-direction (in an XYZ Cartesian framework); in such a case, the chosen linear tract might be the tract resulting from a full-amplitude invocation of the X- or Y-deflector alone, or the diagonal trace resulting from a 50/50 invocation of both coils, etc.

In another embodiment of the invention, the following applies:
  Said beam pattern comprises a first linear tract in a first direction and a second linear tract in a second direction;
  Said geometric aspect is chosen from the group comprising:
    A length ratio of said first and second linear tracts;
    An angle between said first and second linear tracts.

Whereas the previous embodiment can be said to be essentially "one-dimensional" in character, the present embodiment can be regarded as being of a "two-dimensional" nature. In this regard, it is important to note that the invention can be used to directly calibrate the FOV of the detector in one dimension or in two dimensions, depending on whether one or two characteristic dimensions of the aforementioned calibration specimen are employed. For example, if the calibration specimen comprises a crystal with a cubic lattice, then such a specimen can provide two known, orthogonal characteristic dimensions (namely, the side lengths of the cubic lattice), and these can be used to directly calibrate the FOV in, for example, X and Y. Having performed such a two-dimensional FOV calibration, the detector can now be used to investigate non-isometric imaging effects in the STCPM. These may, for example, be caused as follows:
  The imaging system can introduce "preferential distortion", whereby dimensions in one direction (e.g. X) are altered relative to corresponding dimensions in another direction (e.g. Y); for example, such preferential distortion can render a perfect circle as an ellipse, or can make a square look like a rectangle. This is essentially a particle-optical lens aberration.
  With reference to the exemplary STEM scanning set-up described in the previous embodiment, perfect X- and Y-deflectors should ideally produce scan movements that have the same (maximum) amplitude (assuming that said deflectors are of equal strength) and are mutually perpendicular (assuming that the deflectors are correctly aligned with respect to one another); however, imperfections in deflector strength and/or alignment will cause the resulting scan tracts to be skewed and/or of unequal length.
Regardless of the exact cause(s) of such non-isometry, it is important to be able to quantify its resultant/cumulative effect, so as to allow appropriate corrective countermeasures to be taken. The embodiment presented here enables such quantification. For example:
  The employed beam pattern comprises a first linear tract produced by full-amplitude invocation of the X-deflector, and a second linear tract produced by full-amplitude invocation of the Y-deflector (which linear tracts can, once again, be defined in terms of end points or an actual traced path);
  Using the (two-dimensionally) calibrated FOV of the detector, one determines:
    The actual lengths of these respective linear tracts;
    The actual angle between them (by calculating the tangent of the angle in question).
  Non-equality of these line lengths and/or non-orthogonality thereof is indicative of non-isometry as discussed above. The extent of such inequality allows the extent/nature of the isometry to be derived.

In a further embodiment of the current invention, the following applies:
  Said beam pattern comprises an array of test figures, disposed at different coordinate positions in said calibrated field of view;
  Said geometric aspect is distortion, measured as a function of position in said field of view.

Such an embodiment can be regarded as a more sophisticated version of the previous embodiment in that, whereas the previous embodiment sought to get a "coarse scale" indication of (lower-order) anisometry effects in the FOV, the present embodiment refines this to "fine scale" level, allowing a much more detailed (point-by-point) investigation of (lower- and higher-order) distortion phenomena in the FOV. In the previous embodiment, the first and second linear tracts were, for example, defined by four island points disposed proximal four different edges of the FOV and conceptually joined in pairs to form an X-tract and a Y-tract. In contrast, in the current embodiment, a whole array of test figures (e.g. island points, small circles, line segments, etc.) is distributed in matrix arrangement across the area of the FOV. Such an array represents a finer-scale and more regular "grid" against which imaging anomalies (distortion) can be measured. To give an illustrative analogy from the discipline of meteorology, for example, the previous embodiment might be compared to a simple wind measurement using a wind vane, whereas the current embodiment is more akin to creating a mapped wind field (in which a distribution of small arrows is used to indicate local wind direction and strength). One way of performing the current embodiment would, for example, be to program the (setpoints of the) X- and Y-deflectors of the STCPM to steer the scan beam so as to sequentially "visit" the nodes (intersection points) of a regular orthogonal "net", designed to essentially traverse the full extent (or a large portion thereof, such as 90%) of the width and height of the FOV. Each node "visit" by the beam produces a spot that is recorded by the detector, and one thus accumulates a two-dimensional array of such recorded spots in the FOV. In the absence of distortion, this array would correspond exactly to the regular orthogonal net of deflector setpoints; however, in reality, distortion will generally cause the spot positions to deviate from the nodes of said net. If, at each node position, the direction and magnitude of such deviation is calculated, then one can produce a map of localized distortion effects in the FOV (analogous to the aforementioned wind map). Even casual visual inspection of such a distortion map will reveal a wealth of detail, e.g. the presence of so-called "barrel", "pincushion", "saddle" or "vortex" distortion. However, even more detail can typically be derived by using software to mathematically analyze the distortion map. In such a latter instance, one can generally deconvolve a cumulative/resultant distortion into various component distortions, e.g. due to shift, rotation, scaling, shear, skew, etc. Ultimately, the distortion data obtained in this manner can, for example, be used to do one or both of the following:
  Perform a distortion calibration on the FOV. This, for example, may involve calculating a mathematical transform that needs to be applied to "raw" imagery so as to correct it for distortion effects as referred to above.
  Calculate and enact ways of removing such distortion, e.g. by appropriately adjusting correcting and/or deflecting elements in the illuminator/imaging system so as to "pre-cancel" distortion effects as referred to above.

As a possible alternative to the orthogonal array of spots elucidated above, one could, for example, achieve similar information from a nested array of (ideally) concentric circles, which (practically) will typically demonstrate eccentricities as a function of position in the array. Such eccentricities can be inspected/measured to yield information on the underlying distortion effects causing them.

In a carry-on embodiment to that just described, the distortion data obtained in scanning mode—and the distortion calibration made possible thereby—are used as a basis to analyze distortion in non-scanning mode, particularly at lower magnification values (larger FOVs) than those previously used in viewing the calibration specimen (e.g. crystal). Such an embodiment caters to the fact that, in non-scanning mode, an STCPM can typically have a large range of working magnifications (e.g. three orders of magnitude), and that only part of this range (e.g. near maximum magnification) will have been directly utilized in forming the abovementioned calibration image of the calibration specimen. Going back into non-scanning mode with the distortion-calibrated detector allows distortion to be investigated at FOVs that are larger than the levels used in viewing the calibration specimen.

It should generally be noted that, once an STCPM has been calibrated using the inventive method, such calibration can be fruitfully employed in either or both of:
  Transmission mode, where scanning imaging is performed on the basis of (primary) charged particles transmitted through a specimen. In FIG. 1 below, such transmitted radiation is, for example, detected using detector D;
  Auxiliary mode, where scanning imaging is performed on the basis of the abovementioned auxiliary (secondary) radiation (e.g. backscattered electrons, secondary electrons, X-rays, photoluminescence) emitted by a specimen in response to irradiation by the (primary) charged-particle beam. In FIG. 1 below, such auxiliary radiation is, for example, detected using detector 22.

In essence, the current invention can be regarded as calibrating the "scanning functionality" of an STCPM, and this can then be exploited in different types of applications. It should also be noted that, once the inventive calibration has been performed, subsequent metrology-based use of the calibrated STCPM is not limited to quantitative inspection of images, but also extends, for example, to quantitative analysis of pixel maps compiled on the basis of information obtained from a multiple-point collection of spectra or diffractograms.

It should also be noted that, in the invention, calibration of the detector FOV occurs for a particular magnification configuration of the imaging system, and such calibration will not, in general, be usable at other magnification values; typically, re-calibration will be conducted if the microscope user decides to work at another magnification setting. That having been said, it is possible, after performing various calibrations at various magnification values, to make a plot of calibrated characteristic dimension (of the FOV) versus magnification setting; one can then, if desired, use interpolation/extrapolation to (approximately) derive the FOV characteristic dimension value corresponding to certain magnification choices.

As already set forth above, the calibration specimen employed in the current invention can, for example, comprise a crystal with (one or more) well-defined lattice lengths (spacings/pitches). Such a crystal is essentially a "natural" grid structure with a grid size/shape that is determined by fundamental forces of physics and chemistry. Examples of suitable crystals in this context include Si (silicon) and Au (gold), for instance, whereby:
  Si has a cubic (diamond-like) crystalline structure, with lattice pitches along the (111), (200) and (220) crystalline axes of 0.314 nm, 0.271 nm and 0.191 nm, respectively;
  Au has a face-centered cubic (fcc) structure, with lattice pitches along the (111) and (200) crystalline axes of 0.236 nm and 0.20 nm, respectively. These pitches are smaller than in the case of Si, and therefore typically require higher magnifications to be satisfactorily imaged.

As a general note, it deserves mention that, if the employed calibration specimen comprises a repetitive structure (as will typically be the case, certainly when one is using a crystal) then it may be convenient to derive the characteristic spacing (s)/pitch(es) of said structure by calculating (Fast) Fourier Transforms for the specimen image. In the Fourier domain, the various spatial frequencies present in a repetitive structure may manifest themselves more clearly.

The invention will now be elucidated in more detail on the basis of exemplary embodiments and the accompanying schematic drawings, in which:

FIG. 1 renders a longitudinal cross-sectional view of a charged-particle microscope in which an embodiment of the current invention can be carried out.

In the Figures, where pertinent, corresponding parts are indicated using corresponding reference symbols. It should be noted that, in general, the Figures are not to scale.

Embodiment 1

Figure 1:
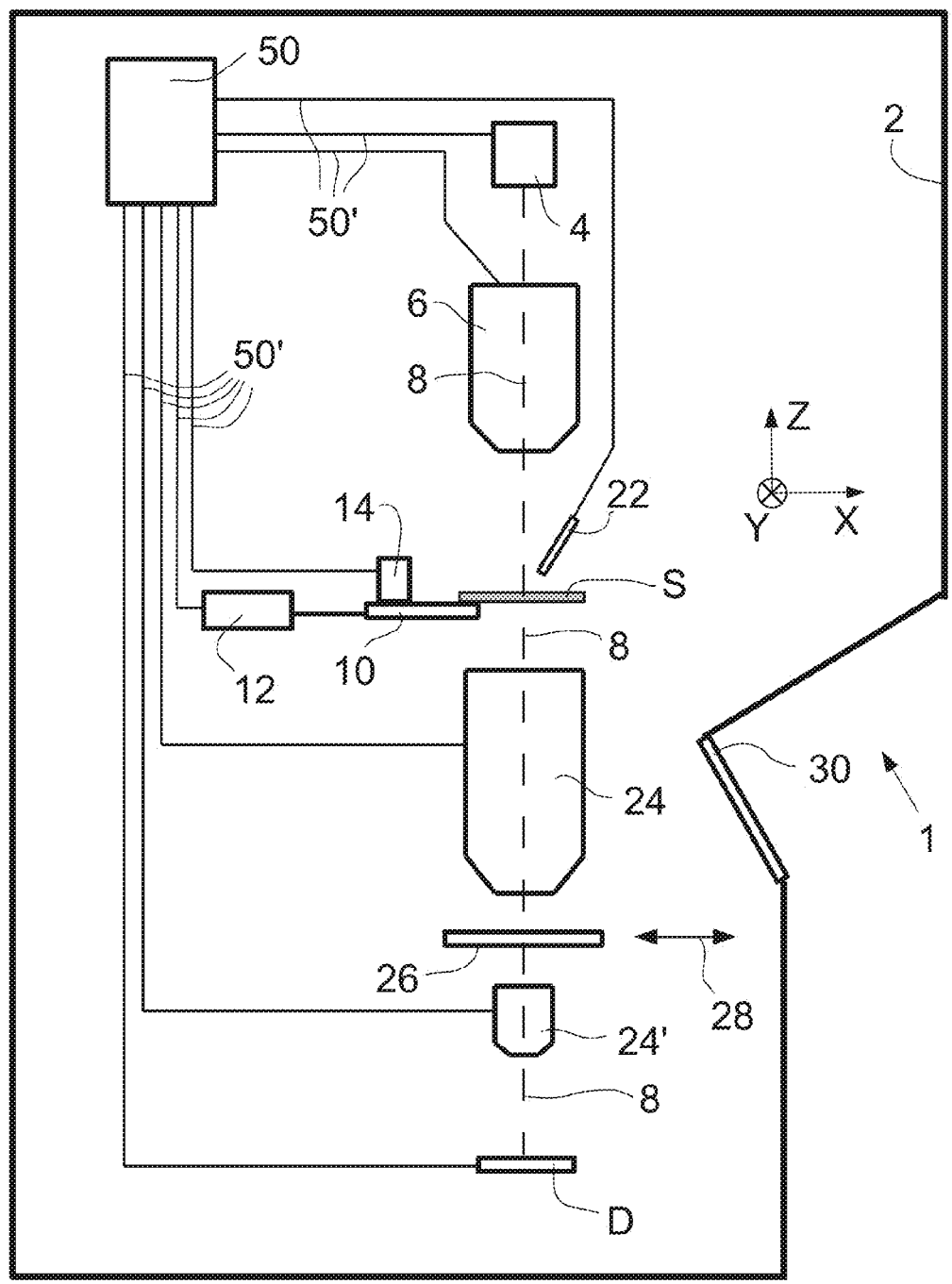

FIG. 1 is a highly schematic depiction of an embodiment of an STCPM 1 that lends itself to use in conjunction with the current invention; the depicted microscope is a STEM (i.e. a TEM, with scanning functionality) but, in the context of the current invention, it could just as validly be an ion-based microscope, for example. In the Figure, within a vacuum enclosure 2, an electron source 4 (such as a Schottky gun, for example) produces a beam of electrons that traverse an electron-optical illuminator 6, serving to direct/focus them onto a chosen region of a (substantially planar) specimen S. This illuminator 6 has an electron-optical axis 8, and will generally comprise a variety of electrostatic/magnetic lenses, (scan) deflectors, correctors (such as stigmators), etc.; typically, it can also comprise a condenser system.

The specimen S is held on a specimen holder 10 that can be positioned in multiple degrees of freedom by a positioning device (stage) 12; for example, the specimen holder 10 may comprise a finger that can be moved (inter alia) in the XY plane (see the depicted Cartesian coordinate system). Such movement allows different regions of the specimen S to be irradiated/imaged/inspected by the electron beam traveling along axis 8 (in the −Z direction) (and/or allows scanning motion to be performed, as an alternative to beam scanning). An optional cooling device 14 is in intimate thermal contact with the specimen holder 10, and is capable of maintaining the latter at cryogenic temperatures, e.g. using a circulating cryogenic coolant to achieve and maintain a desired low temperature.

The (focused) electron beam traveling along axis 8 will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) detector, for instance; in such a case, an image could be constructed using basically the same principle as in a SEM. However, alternatively or supplementally, one can study electrons that traverse (pass through) the specimen S, emerge from it and continue to propagate (substantially, though generally with some deflection/scattering) along axis 8. Such transmitted electrons enter an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electrons onto a fluorescent screen 26, which, if desired, can be retracted/withdrawn (as schematically indicated by arrows 28) so as to get it out of the way of axis 8. An image of (part of) the specimen S will be formed by imaging system 24 on screen 26, and this may be viewed through viewing port 30 located in a suitable portion of the wall 2. The retraction mechanism for screen 26 may, for example, be mechanical and/or electrical in nature, and is not depicted here.

As an alternative to viewing an image on screen 26, one can instead make use of electron detector D, particularly in STEM mode. To this end, adjuster lens 24' can be enacted so as to shift the focus of the electrons emerging from imaging system 24 and re-direct/focus them onto detector D (rather than the plane of retracted screen 26: see above). At detector D, the electrons can form an image (or diffractogram) that can be processed by controller 50 and displayed on a display device (not depicted), such as a flat panel display, for example. In STEM mode, an output from detector D can be recorded as a function of (X,Y) scanning beam position on the specimen S, and an image can be constructed that is a "map" of detector output as a function of X,Y. The skilled artisan will be very familiar with these various possibilities, which require no further elucidation here.

Note that the controller (computer processor) 50 is connected to various illustrated components via control lines (buses) 50'. This controller 50 can provide a variety of functions, such as synchronizing actions, providing setpoints, processing signals, performing calculations, and displaying messages/information on a display device (not depicted). Needless to say, the (schematically depicted) controller 50 may be (partially) inside or outside the enclosure 2, and may have a unitary or composite structure, as desired. The skilled artisan will understand that the interior of the enclosure 2 does not have to be kept at a strict vacuum; for example, in a so-called "Environmental STEM", a background atmosphere of a given gas is deliberately introduced/maintained within the enclosure 2.

In the context of the current invention, such a microscope 1 can be used as follows:

(i) A suitable calibration specimen S, such as a Si crystal, is provided on specimen holder 10. In non-scanning mode, an image of (part of) this specimen S is projected onto, and recorded by, detector D. Such projection can occur at "intermediate" magnification (e.g. of the order of about 50 kx(50 thousand times)), which will generally be sufficient to ensure that the lattice structure of calibration specimen S is clearly visible/detectable.

(ii) The image of calibration specimen S made in step (i) is inspected (visually or/and automatically) and at least one known dimension of specimen S (e.g. a particular lattice pitch along a given crystalline axis) is compared with its image in order to calibrate a characteristic dimension (e.g. a pixel length, or side length) of a field of view (FOV) of said detector D. If desired, such calibration can be performed in more than one direction; for example, different lattice pitches of specimen S could be used to calibrate the FOV of detector D in two complementary/coordinate directions, such as X and Y. As set forth above, such two-dimensional calibration allows subsequent investigation (and correction) of higher-order distortion effects.

(iii) For the next (current) step in this procedure, the specimen S is not necessary, and can be removed (although it may also stay in place, if desired). In this step, the microscope 1 is switched to scanning mode (without changing the employed detector), implying that the electrons propagating along axis 8 will now take the form of a thin beam, which can be deflected at will away from the Z-axis by (at least) a pair of deflectors (not shown) in imaging system 6. In this way, said electron beam can be just "parked" at a particular off-axis (X,Y) coordinate (static deflection) or it can be scanned so as to trace out a trajectory (dynamic deflection), and either/both of these behaviors can be registered/recorded by detector D, which will record just a spot for a parked beam and a traced path for a scanned beam. Using this mechanism, a particular beam pattern is created in the FOV of detector D, e.g. by supplying an appropriate stream of setpoints to said deflectors, and this pattern is recorded by detector D. As set forth above, such a pattern may comprise pre-selected configurations of spots, lines, curves, etc.

(iv) The pattern recorded in step (iii) is now examined (visually or/and automatically). Using the fact that the FOV of detector D was calibrated in step (ii), one or more geometric aspects of the registered pattern can be derived/measured/calibrated (by comparison to the abovementioned calibrated characteristic dimension(s) of the FOV). Such geometric aspects may, for example, comprise one or more of:

A distance between two points;

A length of a line or line segment;

An angle between two lines (whether physical or conceptual);

Spatial deviation of an array of spots from a reference grid, etc. As set forth above, various parameters/types of information (e.g. information on distortion) can be gleaned from this data.

Embodiment 2

Figure 2A:
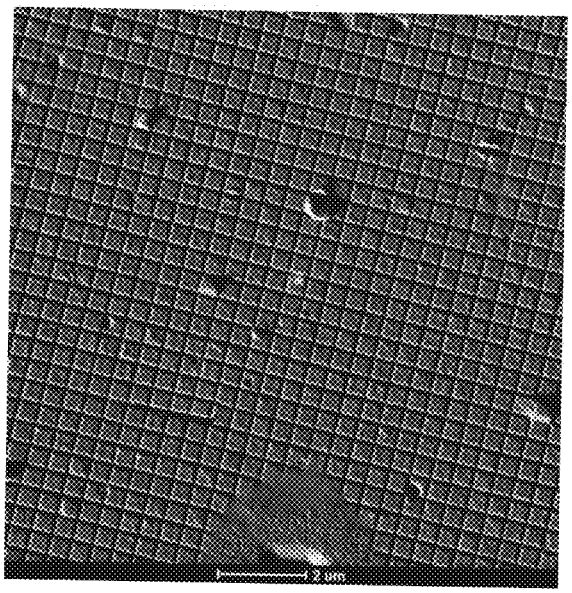
FIG. 2A shows an image of a calibration specimen that can be used to calibrate a charged-particle microscope.
Figure 2B:
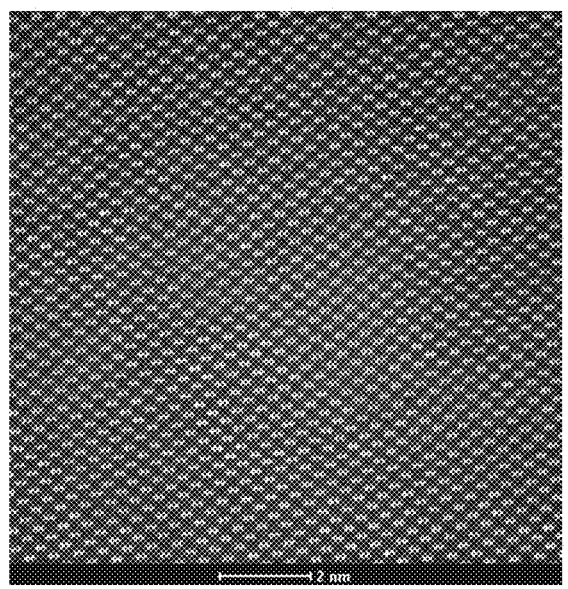
FIG. 2B shows an image of another calibration specimen that can be used to calibrate a charged particle microscope.

FIGS. 2A and 2B shows images of two different types of calibration specimen that can be used to calibrate a CPM. More specifically:

FIG. 2A shows a "cross grating" that is conventionally used to calibrate a CPM at relatively low magnifications. The magnification in this figure is 10 kx(10 thousand times), and the field of view is 12 μm×12 μm.

Such a cross grating can, for example, be created by depositing a thin layer/foil of carbon onto an optical diffraction grating. This carbon layer will then have a three-dimensional structure of square plateaus surrounded by trenches. A suitable metal (e.g. gold-palladium) is then sputtered onto the carbon foil at a low (grazing) angle along one of the diagonals of the squares. The sputtered metal highlights the two 'windward' walls of the trenches, with some metal also on the plateaus, while the 'leeward' trenches will essentially be devoid of metal. The carbon foil is then put onto a metal grid that forms a support. The heavy metals of the sputtered layer make the structure well visible in a charged particle microscope.

Uncertainties/inaccuracies vis-à-vis this kind of calibration specimen arise inter alia from the potential shrinkage/expansion or distortion of the employed thin carbon foil (which has, in itself, very poor rigidity) and/or bending/distortion of the supporting metal grid.

Cross gratings as here described are commercially available from microscopy supplies providers such as Agar Scientific-Elektron Technology UK Ltd., Stansted, Essex, United Kingdom.

It is immediately evident from the figure that a grating of this type is relatively crude and inaccurate, and that there will accordingly be a relatively large error margin (of the order of about 2%, for example) in dimensions calibrated therewith.

FIG. 2B shows a crystalline lattice that can be used to calibrate a CPM at relatively high magnifications; in this particular case, the depicted structure is a Silicon crystal. The magnification in this figure is 7.2 M×(7.2 million times), and the field of view is 12 nm×12 nm. Note that the Si atoms are arranged in an essentially perfectly regular matrix structure, with well-defined lattice spacings that are determined by fundamental characteristics of bonds between the Si atoms; consequently, such lattice spacings (which are well catalogued) act as excellent "known dimensions" for length calibration purposes.

The invention claimed is:

1. A method of calibrating a Scanning Transmission Charged-Particle Microscope comprising:
   a specimen holder, for holding a specimen;
   a source, for producing a beam of charged particles;
   an illuminator, for directing said beam so as to irradiate the specimen;
   an imaging system, for directing charged particles that traverse the specimen onto a detector;
   scanning means, for causing said beam to undergo scanning motion relative to a surface of the specimen,
   which microscope can be operated in:
   a non-scanning mode, whereby said beam is relatively broad and said detector forms an image without invocation of said scanning means; or
   a scanning mode, whereby said beam is relatively narrow and said detector accumulates an image as a function of scan position of said beam,
   said calibration method comprising:
   providing a calibration specimen on said specimen holder;
   in non-scanning mode, using said detector to form a calibration image of the calibration specimen, using a given configuration of said imaging system;
   utilizing a known dimension of said calibration specimen and comparing it to a corresponding dimension in said calibration image to calibrate a characteristic dimension of a field of view of said detector;
   in scanning mode, recording a beam pattern of said beam in the calibrated field of view of said detector, and examining the recorded beam pattern to derive a geometric aspect thereof.

2. A method according to claim 1, wherein said characteristic dimension of the field of view of the detector is selected from the group comprising a pixel size, a side length, a diagonal length, a diameter, a dimension of a field marker, and combinations hereof.

3. A method according to claim 1, wherein:
   said beam pattern comprises a linear tract in a given direction;
   said geometric aspect is a length of said linear tract.

4. A method according to any of claim 1, wherein:
   said beam pattern comprises a first linear tract in a first direction and a second linear tract in a second direction;
   said geometric aspect is chosen from the group comprising:
   a length ratio of said first and second linear tracts;
   an angle between said first and second linear tracts.

5. A method according to claim 1, wherein:
   said beam pattern comprises an array of test figures, disposed at different coordinate positions in said calibrated field of view;
   said geometric aspect is distortion, measured as a function of position in said field of view.

6. A method according to claim 5, wherein said distortion is selected from the group comprising shift, rotation, scaling, shear, skew, and combinations hereof.

7. A method according to claim 1, wherein said calibration specimen comprises a crystal, and said known dimension is a lattice length of the crystal.

8. A charged-particle microscope, comprising:
   a specimen holder, for holding a specimen;
   a source, for producing a beam of charged particles;
   an illuminator, for directing said beam so as to irradiate the specimen;
   an imaging system, for directing charged particles that traverse the specimen onto a detector;
   scanning means, for causing said beam to undergo scanning motion relative to a surface of the specimen,
   a controller, for executing control commands,
   which microscope can be operated in:
   a non-scanning mode, whereby said beam is relatively broad and said detector forms an image without invocation of said scanning means; or
   a scanning mode, whereby said beam is relatively narrow and said detector accumulates an image as a function of scan position of said beam; and
   in which the controller is programmed to execute the following steps:
   in non-scanning mode, using said detector to form a calibration image of a calibration specimen, using a given configuration of said imaging system;
   utilizing a known dimension of said calibration specimen and comparing it to a corresponding dimension in said calibration image to calibrate a characteristic dimension of a field of view of said detector;
   in scanning mode, recording a beam pattern of said beam in the calibrated field of view of said detector, and examining the recorded beam pattern to derive a geometric aspect thereof.

9. The charged particle microscope of claim 8, wherein the beam pattern comprises an array of test figures, disposed at different coordinate positions in said calibrated field of view; and
   the geometric aspect is distortion, measured as a function of position in said field of view.

10. The charged particle microscope of claim 9, wherein said distortion is selected from the group comprising shift, rotation, scaling, shear, skew, and combinations hereof.

11. The charged particle microscope of claim 8, wherein said calibration specimen comprises a crystal, and said known dimension is a lattice length of the crystal.

12. The charged particle microscope of claim 8, wherein said beam pattern comprises a linear tract in a given direction; and
   said geometric aspect is a length of said linear tract.

13. The charged particle microscope of claim 8, wherein said beam pattern comprises a first linear tract in a first direction and a second linear tract in a second direction, said geometric aspect is chosen from the group comprising:
   a length ratio of said first and second linear tracts; and
   an angle between said first and second linear tracts.

14. The charged particle microscope of claim 8, wherein said characteristic dimension of the field of view of the detector is selected from the group comprising a pixel size, a side length, a diagonal length, a diameter, a dimension of a field marker, and combinations hereof.

\* \* \* \* \*